United States Patent
Rosnell et al.

(10) Patent No.: US 6,917,244 B2
(45) Date of Patent: Jul. 12, 2005

(54) POWER CONTROL FOR A SWITCHING MODE POWER AMPLIFIER

(75) Inventors: Seppo Rosnell, Salo (FI); Jukka Varis, Halikko (FI)

(73) Assignee: Nokia Corporation, Espoo (FI)

(*) Notice: Subject to any disclaimer, the term of this patent is extended or adjusted under 35 U.S.C. 154(b) by 12 days.

(21) Appl. No.: 10/459,135

(22) Filed: Jun. 10, 2003

(65) Prior Publication Data

US 2004/0251962 A1 Dec. 16, 2004

(51) Int. Cl.[7] .............................. H03G 3/20; H03G 3/30
(52) U.S. Cl. ....................... 330/134; 330/279; 330/285
(58) Field of Search ................................ 330/129, 133, 330/134, 279, 285, 296, 297

(56) References Cited

U.S. PATENT DOCUMENTS

| | | | |
|---|---|---|---|
| 3,900,823 A | 8/1975 | Sokal et al. | 330/149 |
| 3,919,656 A | 11/1975 | Sokal et al. | 330/51 |
| 5,276,912 A | 1/1994 | Siwiak et al. | 455/73 |
| 5,278,517 A * | 1/1994 | Fujita | 330/279 |
| 5,646,577 A * | 7/1997 | Ishikura | 330/279 |
| 5,670,911 A * | 9/1997 | Hori et al. | 330/296 |
| 6,043,707 A | 3/2000 | Budnik | 330/10 |
| 6,288,606 B1 | 9/2001 | Ekman et al. | 330/51 |
| 6,323,731 B1 | 11/2001 | McCune, Jr. | 330/251 |
| 6,438,360 B1 | 8/2002 | Alberth, Jr. et al. | 330/129 |

FOREIGN PATENT DOCUMENTS

| | | |
|---|---|---|
| WO | 9849771 | 11/1998 |
| WO | WO 0229969 | 4/2002 |

OTHER PUBLICATIONS

"L-Band Transmitter Using Kahn EER Technique," by F. H. Raab, B. E. Sigmon, R. G. Myers and R. M. Jackson, *IEEE Transactions on Microwave Theory and Techniques*, vol. 46, No. 12, Dec. 1998, pp. 2220–2225.

"Linear Amplification With Nonlinear Components," by D. C. Cox, *IEEE Transactions on Communications*, Dec. 1974, pp. 1942–1945.

"Single-Sideband Transmission by Envelope Elimination and Restoration," by L. R. Kahn, *Proceedings of the I.R.E.*, Jul. 1952, pp. 803–806.

* cited by examiner

*Primary Examiner*—Khanh V. Nguyen
(74) *Attorney, Agent, or Firm*—Alfred A. Fressola; Ware, Fressola, Van Der Sluys & Adolphso

(57) ABSTRACT

The invention relates to a power control structure comprising a switching mode power amplifier for receiving an input signal, for amplifying the received input signal and for providing the amplified signal as output signal. In order to enable a power control over a large range while preserving the efficiency of the power amplifier, the structure further comprises a first control arrangement for controlling the power level of the output signal at least at higher desired power levels by adjusting a power supply provided to the switching mode power amplifier, and in addition a second control arrangement for controlling the power level of the output signal at least at lower desired power levels by adjusting the power of the input signal before it is provided to the switching mode power amplifier. The invention relates equally to a corresponding method.

21 Claims, 9 Drawing Sheets

POWER CONTROL FOR A SWITCHING MODE POWER AMPLIFIER

FIELD OF THE INVENTION

The invention relates to a power control structure comprising a switching mode power amplifier for receiving an input signal, for amplifying a received input signal and for providing the amplified signal as output signal. The invention relates equally to a method of controlling at least a power level of an output signal of such a switching mode power amplifier.

BACKGROUND OF THE INVENTION

Switching mode power amplifiers are known from the state of the art as particularly efficient power amplifiers. Class-E amplifiers, for example, which have been presented in U.S. Pat. No. 3,919,656, are switching mode power amplifiers which can theoretically approach a power efficiency of 100%. Switching mode power amplifiers are used for example in transmitter architectures which require a low power consumption, like transmitter architectures employed for mobile devices.

While a switching mode power amplifier can be very efficient, it is inherently very non-linear, i.e. the amplitude of its output signals are not affected linearly by a change of the amplitude of its input signals within the regular operating range. On the other hand, a switching mode power amplifier does not alter significantly the phase of input phase modulated signals. Thus, switching mode power amplifiers are rather suited for amplifying constant-envelope phase modulated signals than amplitude modulated signals.

In some cases, signals that are to be amplified have no envelope variation in the first place. In some other cases, the switching mode power amplifier does not see the envelope variation, e.g. in the LINC system (LInear amplification using Non-linear Components) proposed by D. C. Cox of the Bell laboratories in "Linear Amplification with Nonlinear Components", IEEE Transactions on Communications, COM-22, pp. 1942 to 1945, December 1974, or when using a bandpass pulse position modulation (PPM). In the latter case, the structure comprising the switching mode power amplifier as a whole takes care of generating the correct envelope for the transmitter output signal.

A structure employing a switching mode power amplifier is given for example with a conventional envelope elimination and restoration (EER) transmitter. In such an EER transmitter, a constant-envelope phase-modulated radio-frequency signal is input to the switching mode power amplifier for amplification. The envelope is then restored in the switching mode power amplifier by varying its supply power.

In most applications, it is required that the average power level of the signals output by a power amplifier can be controlled, possibly even over a very large dynamic range. In a conventional power control of the output power level of a power amplifier, a variable gain amplifier (VGA) is arranged in front of the power amplifier, which pre-amplifies the input signal according to the desired output power level. Since a switching mode power amplifier is inherently very non-linear, however, a conventional power control is not suitable for a switching mode power amplifier. On the other hand, the dynamic range that can be achieved by varying the power supply to the switching mode power amplifier mentioned above is restricted by a lower limit. This lower limit results from a leakage of an input radio frequency signal through the transistor of the switching mode power amplifier due to its parasitic capacitances.

There are various documents dealing with the power control of switching mode power amplifiers.

F. H. Raab, B. E. Sigmon, R. G. Myers and R. M. Jackson, for instance, discuss in the document: "L-Band Transmitter Using Kahn EER Technique", IEEE Transactions on Microwave Theory and Techniques, Vol. 46, No. 12, December 1998, the use of non-linear power amplifiers in EER architectures and mention that the drive level to the power amplifier should be adjusted in order to maintain the output saturation at all supply voltage values.

Document WO 98/49771 proposes to treat voltage and bias current control of the power amplifier in order to improve the efficiency at low power levels.

Document U.S. Pat. No. 6,323,731 proposes to use a dynamic bias control for the power amplifier in order to widen the output power range in case where the power control is accomplished through the power amplifier supply voltage.

None of these documents, however, enables a linear power control for a switching mode power amplifier over a very large dynamic range while preserving the efficiency of the amplifier.

SUMMARY OF THE INVENTION

It is an object of the invention to enable an improved power control for a switching mode power amplifier. It is further an object of the invention to enable a power control which ensures that the value of an output signal of a switching mode power amplifier follows a control value as linearly as possible while preserving the efficiency of the amplifier over a large range of the output power.

A power control structure is proposed which comprises a switching mode power amplifier for receiving an input signal, for amplifying the received input signal and for providing the amplified signal as an output signal. The proposed structure further comprises a first control arrangement for controlling the power level of the output signal at least at higher power levels desired for the output signal by adjusting a power supply provided to the switching mode power amplifier. Moreover, the proposed structure comprises a second control arrangement for controlling the power level of the output signal at least at lower power levels desired for the output signal by adjusting the power of the input signal before it is provided to the switching mode power amplifier.

In addition, a method of controlling at least a power level of an output signal of a switching mode power amplifier is proposed. The switching mode power amplifier is assumed to receive an input signal, to amplify the received input signal and to provide the amplified signal as an output signal. The proposed method comprises on the one hand controlling the power level of the output signal by adjusting a power supply provided to the switching mode power amplifier at least when higher power levels are desired for the output signal. On the other hand, the proposed method comprises controlling the power level of the output signal by adjusting the power of the input signal before it is provided to the switching mode power amplifier at least when lower power levels are desired for the output signal.

At higher desired output power levels, the output power level is thus controlled in a conventional manner by adjusting the power supply to the switching mode amplifier, thereby preserving the efficiency of the amplifier. At lower desired output power levels, however, the output power level is controlled by adjusting the amplitude of the input signal before it is provided to the switching mode power amplifier. At lower power levels, the leakage through the transistor of the switching mode power amplifier is made use of. In this case the efficiency of the switching mode power amplifier is not as important, since the DC current is already low. In between the higher output power levels and the lower output power levels, both approaches can be combined.

It is an advantage of the invention that it provides an alternative to known approaches for a power control of a switching mode amplifier.

It is further an advantage of the invention that it enables a linear control of the power level at the output of a switching mode power amplifier over a wide power range, while preserving the efficiency of the switching mode power amplifier at higher power levels.

It is further an advantage of the invention that it requires few or no extra radio-frequency components compared to a situation in which no power control is performed or in which the power control has a narrow range.

Preferred embodiments of the invention become apparent from the dependent claims.

The proposed method and the proposed structure can be employed for controlling only the output power level of the switching mode power amplifier, e.g. in case a constant-envelope signal is to be provided at the output of the switching mode amplifier.

In a preferred embodiment, however, the proposed method and the proposed structure can be employed in addition for controlling an amplitude modulation of the signal output by the switching mode power amplifier. In this case, the required dynamic range has to cover both, the average power level variation and the desired amplitude variation. Thus, both, power level control and amplitude modulation are realized by adjusting on the one hand a power supply provided to the switching mode power amplifier at higher desired output power levels and on the other hand a pre-amplification of the input signal at lower desired output power levels.

The employed switching mode amplifier can be selected arbitrarily. It can be for instance, but not exclusively, a class-E switching mode amplifier.

The invention can be employed for example for extending a conventional EER transmitter.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are merely intended to conceptually illustrate the structures and procedures described herein.

DETAILED DESCRIPTION OF THE INVENTION

Figure 1:
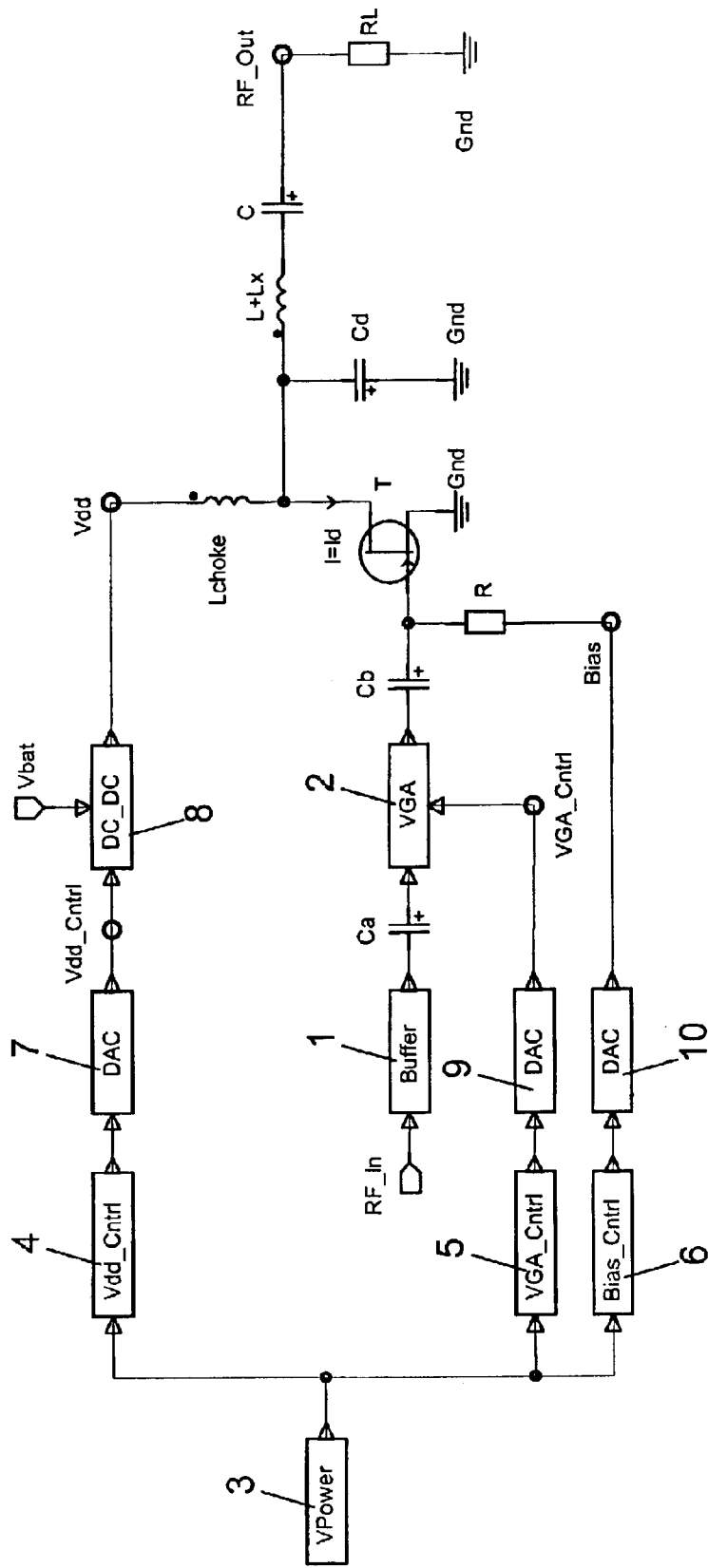
FIG. 1 is a block diagram of a first embodiment of a power control structure according to the invention.

FIG. 1 is a schematic block diagram of a first embodiment of a power control structure according to the invention. The structure can be for example a transmitter or a part of a transmitter which is employed for amplifying a constant envelope signal. The average power level of the amplified output signal has to be controllable over a large range.

The power control structure of FIG. 1 comprises a class-E switching mode power amplifier. The switching mode power amplifier includes a field effect transistor (FET) T. A voltage supply terminal of the switching mode power amplifier is connected via a choke coil Lchoke to the drain of the transistor T. The drain of the transistor T is further connected via a first capacitor Cd to ground Gnd and via a second coil L+Lx and a second capacitor C to the output RF_Out of the switching mode power amplifier. The output RF_Out of the switching mode power amplifier constitutes at the same time the output of the presented structure. The source of the transistor T is equally connected to ground Gnd. The gate of the transistor T is connected on the one hand via a resistor R to a bias control terminal and on the other hand to the input of the switching mode power amplifier.

The power control structure of FIG. 1 further comprises a signal input terminal RF_In connected to a buffer 1. The output of the buffer 1 is connected via a third capacitor Ca to the input of a VGA 2. The output of the VGA 2 is connected via a fourth capacitor Cb to the input of the switching mode power amplifier.

The power control structure of FIG. 1 further comprises a power control unit 3. The output of the power control unit 3 is connected in parallel to the respective input of a Vdd control unit 4, of a VGA control unit 5 and of a bias control unit 6.

The output of the Vdd control unit 4 is connected via a first digital-to-analog converter DAC 7 to a control input of a DC/DC converter 8. A battery (not shown) is connected to a power supply input of the DC/DC converter 8, and the output of the DC/DC converter 8 is connected to the voltage supply terminal of the switching mode power amplifier. Vdd control unit 4, DAC 7 and DC/DC converter 8 constitute a first control arrangement.

The output of the VGA control unit 5 is connected via a second digital-to-analog converter DAC 9 to a control input of the VGA 2. VGA control unit 5 and DAC 9 constitute a second control arrangement.

The output of the bias control unit 6 is connected via a third digital-to-analog converter DAC 10 to the bias control terminal of the switching mode power amplifier. Bias control unit 6 and DAC 10 constitute a third control arrangement.

Finally, a load RL, for instance an antenna, is arranged between the output RF_Out of the switching mode amplifier and ground Gnd.

The power control structure of FIG. 1 is operated as follows.

A constant-envelop radio-frequency signal which is to be amplified in a power controlled manner is applied to the input terminal RF_In of the power control structure and buffered in the buffer 1. The input signal is then provided by the buffer 1 via the third capacitor Ca to the VGA. The VGA pre-amplifies the received signal using a gain which depends on a control voltage applied to its control input. The pre-amplified signal is then provided via the fourth capacitor Cb to the input of the switching mode amplifier, which further amplifies the received signal. The amplification factor used by the switching mode amplifier depends mainly on a voltage Vdd applied to its voltage supply terminal. The further amplified signal is then provided via the output RF_Out of the switching mode amplifier to the load RL.

It is now an aim to be able to control the power level of the output signal linearly over a wide range in response to a control signal.

The voltage control unit 3 provides this control signal in the form of a digital word which denotes the currently desired output power of the switching mode amplifier. The digital word is provided to the Vdd control unit 4, to the VGA control unit 5 and to the bias control unit 6.

The Vdd control unit 4 maps the received digital word according to a first predetermined association to a digital Vdd control word and provides this Vdd control word to the first DAC 7. The first DAC 7 converts the received digital Vdd control word into a suitable analog control voltage Vdd_Cntrl. This analog control voltage Vdd_Cntrl controls the output level of the DC/DC converter 8. More specifically, the DC/DC converter 8 regulates a voltage received at its power supply input from the battery depending on the received control voltage Vdd_Cntrl. The DC/DC converter 8 has a high efficiency within the allowed range of the control voltage Vdd_Cntrl. The regulated voltage Vdd is then applied to the voltage supply terminal of the switching mode power amplifier.

At the same time, the VGA control unit 5 maps the received digital word according to a second predetermined association to a digital VGA control word and provides this VGA control word to the second DAC 9. The second DAC 9 converts the received digital VGA control word into a suitable analog control voltage VGA_Cntrl and applies this control voltage VGA_Cntrl to the control input of the VGA. Thereby, the gain of the VGA is controlled.

Moreover, the bias control unit 6 maps the received digital word according to a third predetermined association to a digital bias control word and provides this bias control word to the third DAC 10. The third DAC 10 converts the received digital bias control word into a suitable analog control voltage 'Bias' and applies this control voltage 'Bias' to the bias control terminal of the switching mode amplifier.

The power level of the signal at the output terminal RF_Out depends mainly on the applied supply voltage Vdd and on the gain applied by the VGA for pre-amplifying the input radio frequency signal. The first and the second predetermined association employed in the Vdd control unit 4 and in the VGA control unit 5, respectively, are selected such that at high power levels, mainly the control voltage Vdd_Cntrl takes care of the power control, thus preserving the good efficiency of the class-E amplifier. At low power levels, the leakage signal through the transistor T due to its parasitic capacitances prevents using this approach. The leakage does not depend on the supply voltage Vdd. Thus, at low levels of the supply voltage Vdd, the leaked signal is greater than the amplified signal, if the VGA is not tuned. The first and the second predetermined association employed in the Vdd control unit 4 and in the VGA control unit 5, respectively, are therefore further selected such that at low power levels, the leakage is utilized by using a constant value for the analog control signal Vdd_Cntrl and thus of the supply voltage Vdd provided to the switching mode power amplifier, while the control voltage VGA_Cntrl takes care of the power control.

The third voltage that is tuned as a function of the digital word output by the power control unit 3 is the bias voltage 'Bias'. At the highest power level, it should be tuned for maximum efficiency, and at low power levels, it can be tuned slightly in the direction that better closes the transistor T and decreases the leakage current Id through it, which improves equally the efficiency of the switching mode power amplifier.

Obviously, the predetermined associations employed by the Vdd control unit 4, the VGA control unit 5 and the bias control unit 6, respectively, can be selected among a great variety of possible associations. In selecting the predetermined associations, only the general goal has to be considered, i.e. making the output power follow a voltage represented by the digital word provided by the power control unit 3 as linearly as possible, while preserving at the same time the high efficiency of the switching mode amplifier over a wide range of output power levels. The details of the total control mechanism depend also on the particular transistor T selected for the switching mode power amplifier.

Figure 2:
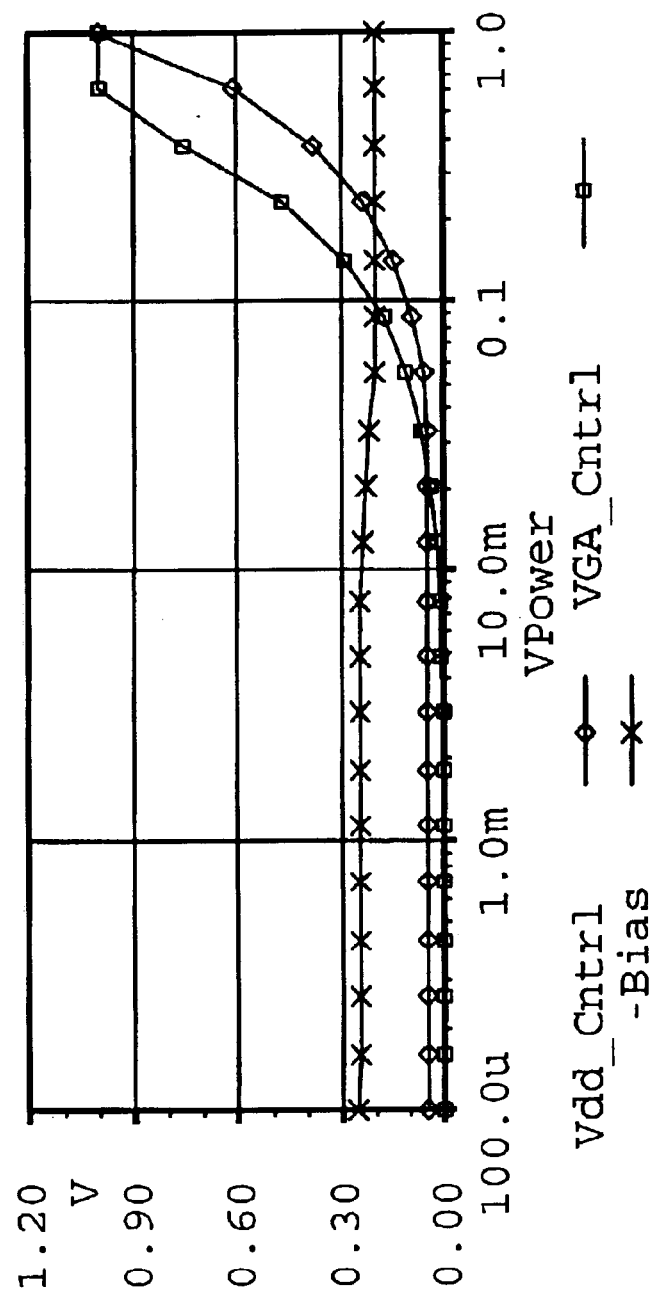
FIG. 2 is a diagram presenting exemplary control voltages employed in the power control structure of FIG. 1.

A simple example for the predetermined associations is graphically depicted in FIG. 2. FIG. 2 is a diagram, in which values in Volt V of the control voltages Vdd_Cntrl, VGA_Cntrl and 'Bias' are associated to a power control voltage VPower represented by the digital word provided by the power control unit 3. The values of the control voltage 'Bias' are negative values. For the power control voltage VPower, a logarithmic scale has been used.

As can be seen, at high desired output power levels, represented by a power control voltage VPower greater than 0.5, the control voltage VGA_Cntrl is constant and the power control is fully taken care of by the control voltage Vdd_Cntrl. Likewise, at low power levels, represented by a power control voltage VPower smaller than 0.05, the control Vdd_Cntrl is constant and the output power is solely controlled by the control voltage VGA_Cntrl. Between the values 0.05 and 0.5, both control voltages change at the same time, in order to smoothen the transition between the two modes. Moreover, the control voltage 'Bias' is changed towards more negative values at low power levels in order to preserve the efficiency of the switching mode power amplifier.

Figure 3:
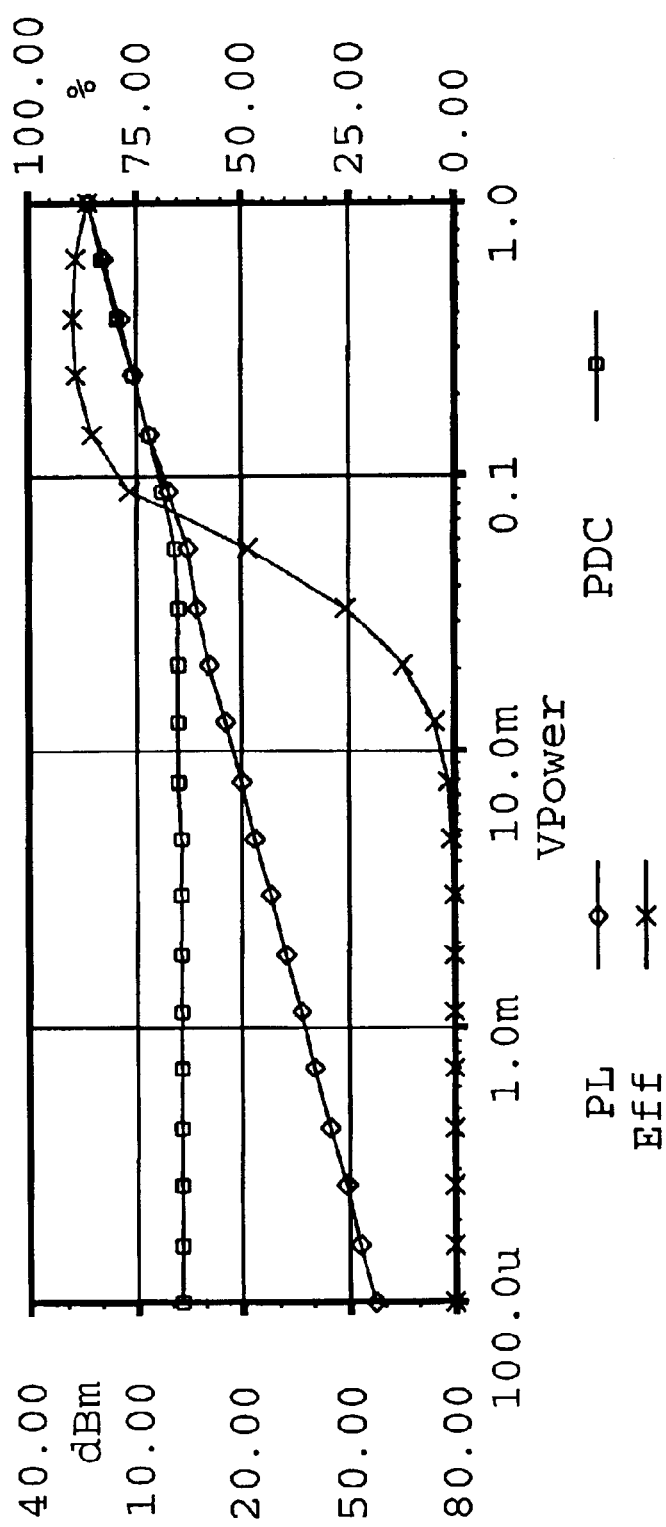
FIG. 3 is a diagram illustrating effects of the control voltages presented in FIG. 2 in the structure of FIG. 1.

Effects of the power control when using predetermined associations according to FIG. 2 in the Vdd control unit 4, the VGA control unit 5 and the bias control unit 6 are depicted in FIG. 3. FIG. 3 is a diagram presenting for this case the power level PL of the output signal, the efficiency EFF of the switching mode power amplifier and the DC-power PDC as a function of the power control voltage VPower represented by the digital word which is provided by the power control unit 3. The scale in dBm for the output power PL and for the DC-power PDC is shown at an y-axis on the left hand side, while the percentages % of the efficiency EFF are shown at an y-axis on the right hand side of the diagram. For the power control voltage VPower, a logarithmic scale has been used again.

As can be seen in FIG. 3, the decibel values of the power level PL of the output signal are presented as a straight line, i.e. the output power depends linearly on the power control voltage VPower as intended. At high power levels where the efficiency is high, the DC-power PDC is only slightly higher than the output power PL. The efficiency EFF drops rapidly when the control voltage Vdd_Cntrl is set to a constant value for lower power levels, but this can be permitted, since the DC-power PDC at that point will already be quite low compared to its maximum value. In the present example, the DC-current drops from its maximum value 79 mA to below 4 mA (not shown in the figure).

Figure 4:
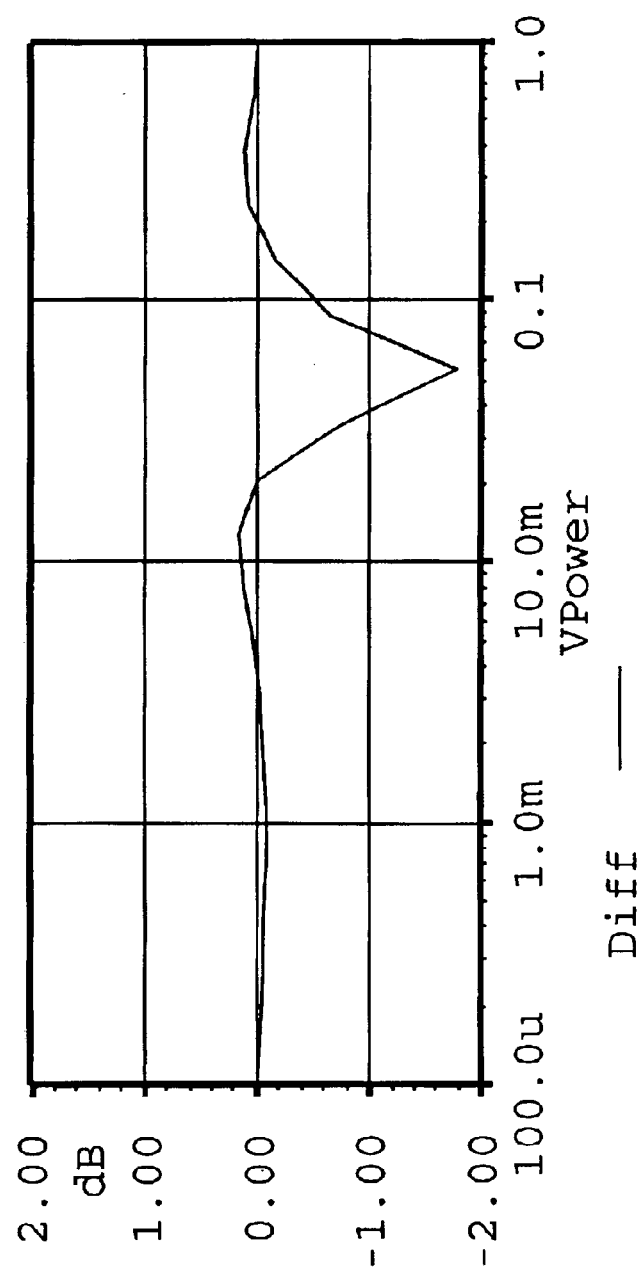
FIG. 4 is a diagram illustrating the deviation of the power of an output signal from a straight line when using the control voltages of FIG. 2 in the structure of FIG. 1.
Figure 5:
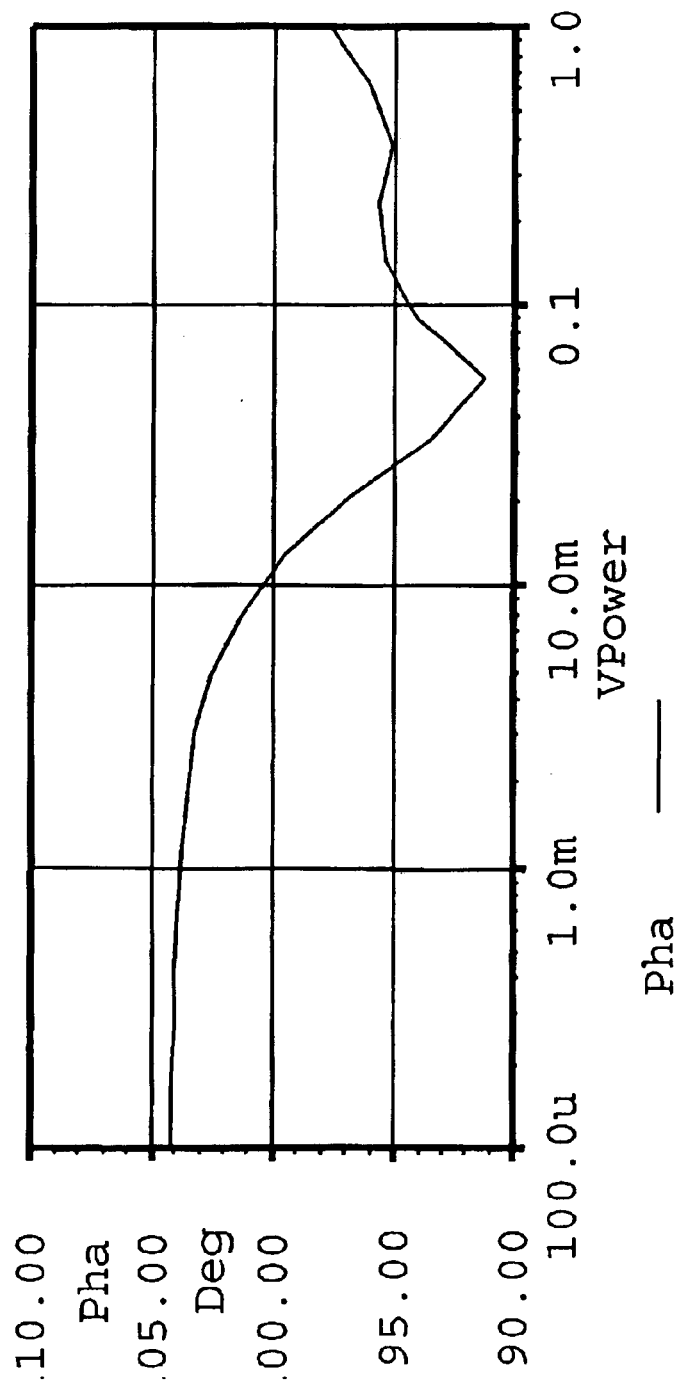
FIG. 5 is a diagram illustrating the phase of an output signal when using the control voltages of FIG. 2 in the structure of FIG. 1.

Most problematic in the proposed power control is the transition range between the higher and the lower power levels. FIG. 4 is a diagram presenting the deviation Diff in dB of the output power from a straight line over the power control voltage VPower. The straight line coincides at its end points with the simulated output power line PL of FIG. 3. FIG. 5 presents the behavior of the output phase Pha in degrees over the power control voltage VPower. For the power control voltage VPower, a logarithmic scale has been used again in both figures. The ideal situation would be a straight horizontal line for both, output power deviation Diff and output signal phase Pha.

All three control voltages Vdd_Cntrl, VGA_Cntrl and 'Bias' affect the shape of the curves presented in FIGS. 4 and 5 in the transition range. The deviation is strongest in the range in which the amplified signal and the leaked signal overlap. Hence, there are a number of possibilities to straighten either the power level curve Diff or the phase curve Pha or both by adjusting these control voltages. A more elaborate method would use e.g. an extra phase correction stage for the incoming radio frequency signal, in order to keep the phase of the output signal constant.

Figure 6:
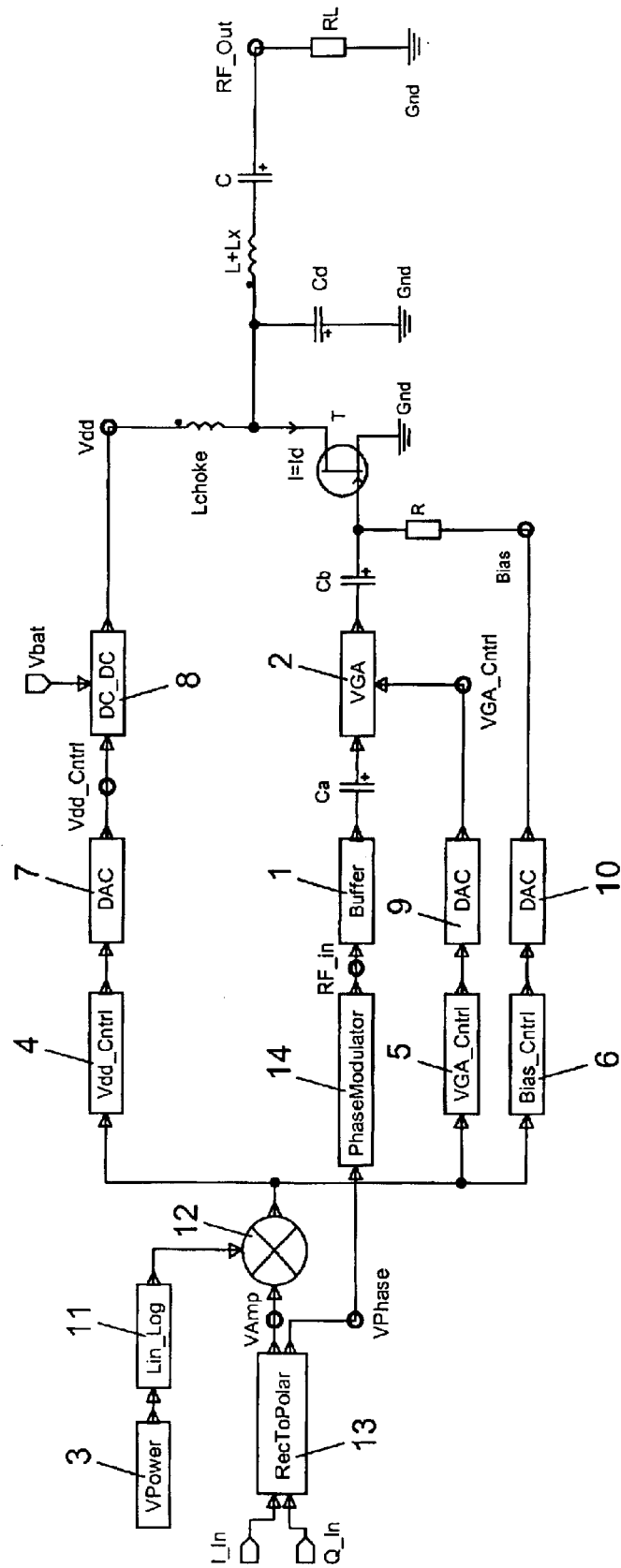
FIG. 6 is a block diagram of a second embodiment of a power control structure according to the invention.

FIG. 6 is a schematic block diagram of a second embodiment of a power control structure according to the invention. The power control structure depicted in FIG. 1 provides a possibility of changing the output power in decibels linearly as a function of a power control voltage VPower represented by a digital control word. The structure depicted in FIG. 6, in contrast, provides a possibility of changing the amplitude of the output signal linearly as a function of an additional amplitude control voltage VAmp represented by a digital control word. At the same time, a power control over a large range is still possible. The structure presented in FIG. 6 constitutes an extension of a conventional EER transmitter.

The structure of FIG. 6 comprises exactly the same components as the structure of FIG. 1, and these components are also arranged in exactly the same manner as in FIG. 1 except for the power control unit 3. Correspondingly, also the same reference signs as in FIG. 1 were assigned in FIG. 6 to corresponding components.

In contrast to the power control structure of FIG. 1, the power control unit 3 of the power control structure of FIG. 6 is connected via a linear-to-logarithmic converter 11 to a first input of a multiplier 12. The structure of FIG. 6 further comprises an input terminal I_In and an input terminal Q_In, each connected to a respective input of a rectangular-to-polar converter 13. A first output of the rectangular-to-polar converter 13 is connected to a second input of the multiplier 12. The output of the multiplier 12 is connected to the Vdd control unit 4, to the VGA control unit 5 and to the bias control unit 6, just like the power control unit 3 in the structure of FIG. 1. Finally, a second output of the rectangular-to-polar converter 13 is connected via a phase modulator 14 to the input terminal RF_In.

The power control structure of FIG. 6 is operated as follows.

A band-pass signal x(t) which is modulated in amplitude and phase can be represented in a canonical form as:

$$x(t)=I(t)\cdot\cos(\omega t)-Q(t)\cdot\sin(\omega t),$$

where I(t) and Q(t) constitute the in-phase and quadrature components of the signal. The in-phase and quadrature components can be determined and provided by a DSP or a dedicated hardware.

A phase and amplitude modulated signal represented by its in-phase and quadrature components is to be processed for transmission by the structure of FIG. 6. The required processing comprises generating a corresponding phase and amplitude modulated radio-frequency signal having a desired average power level.

The in-phase component of the phase and amplitude modulated signal is applied to the input terminal I_In, and the quadrature component of the signal is applied to the input terminal Q_In. This rectangular representation is converted by the rectangular-to-polar converter 13 to a corresponding polar representation. The rectangular-to-polar converter 13 outputs more specifically a voltage VPhase representing the desired phase modulation and a digital word corresponding to an amplitude control voltage VAmp which indicates the desired envelope.

The voltage VPhase provided by the rectangular-to-polar converter 13 is input as control voltage to the phase modulator 14. The phase modulator 14 generates a constant-envelope radio-frequency signal which is phase-modulated according to the received voltage VPhase. Instead of a phase modulator, also a frequency modulator could be used. In this case, the rectangular-to-polar converter 13 should output a voltage representing a frequency modulation, as the derivative of the desired phase modulation, instead of a voltage representing directly the desired phase modulation. As a matter of fact, any modulator that is capable of generating a phase modulated signal can be used, like for instance an IQ-modulator.

The generated phase-modulated constant-envelope radio-frequency signal is then forwarded by the phase modulator 14 to the input terminal RF_In. The signal applied to the input terminal RF_In can thus be written as $$s_{in}(t)=A\cos[\omega t+\phi(t)],$$

where $\omega$ represents the center angular frequency of the signal, A represents an arbitrary amplitude and $\phi(t)$ represents the phase modulation.

This signal is forwarded via the buffer 1, the third capacitor Ca, the VGA 2 and the fourth capacitor Cb to the input of the switching mode amplifier as described with reference to FIG. 1.

The digital word representing the amplitude control voltage Vamp, which is output by the rectangular-to-polar converter 13, is provided to the multiplier 12.

In addition, the power control unit 3 outputs a digital word corresponding to a power control voltage VPower which represents the currently desired average power level of the output signal of the transmitter, similarly as the power control unit 3 in the power control structure of FIG. 1. The digital word is converted in the linear-to-logarithmic converter 11 in such a way that the decibel values of the output power are linearly dependent on the voltage represented by the converted digital word. In terms of the represented power control voltage VPower, the conversion is performed using the equation:

$$V_{Log}=10^{s(V_{Lin}-1)},$$

where $V_{Lin}$ denotes the power control voltage VPower, where $V_{Log}$ denotes the output of the converter 11 and where s denotes the desired slope. For example, using s=4 results in a dynamic range of about 80 dB for the output power, when the power control voltage VPower varies from 0 to 1.

The output of the linear-to-logarithmic converter 11 is equally provided to the multiplier 12. The multiplier 12 multiplies the two received digital words representing the voltages VAmp and $V_{Log}$, and outputs a digital word representing a multiplied voltage VAmp*$V_{Log}$.

Ideally, the system multiplies the signal applied to input terminal RF_In by the signal represented by the digital word that exists at the output of the multiplier 12. Thus, the ideal output radio-frequency signal at the output terminal RF_Out as a function of time t would be $$s_{out}(t)=V_{Amp}(t)V_{Log}(t)\cos[\omega t+\phi(t)].$$

How well the output signal actually follows this ideal situation depends on the implementation of the control units 4 to 6.

The digital word output by the multiplier 12 is forwarded to the Vdd control unit 4, the VGA control unit 5 and the bias control unit 6 and processed just like the digital word representing the power control voltage VPower in the system of FIG. 1. Thus, in a simple example, the association presented in FIG. 2 between the power control voltage VPower on the one hand and the voltages Vdd_Cntrl, VGA_Cntrl and 'Bias' on the other hand can be used in the second embodiment as association between the product VAmp*$V_{Log}$ on the one hand and the control voltages Vdd_Cntrl, VGA_Cntrl and 'Bias' on the other hand.

Figure 7:
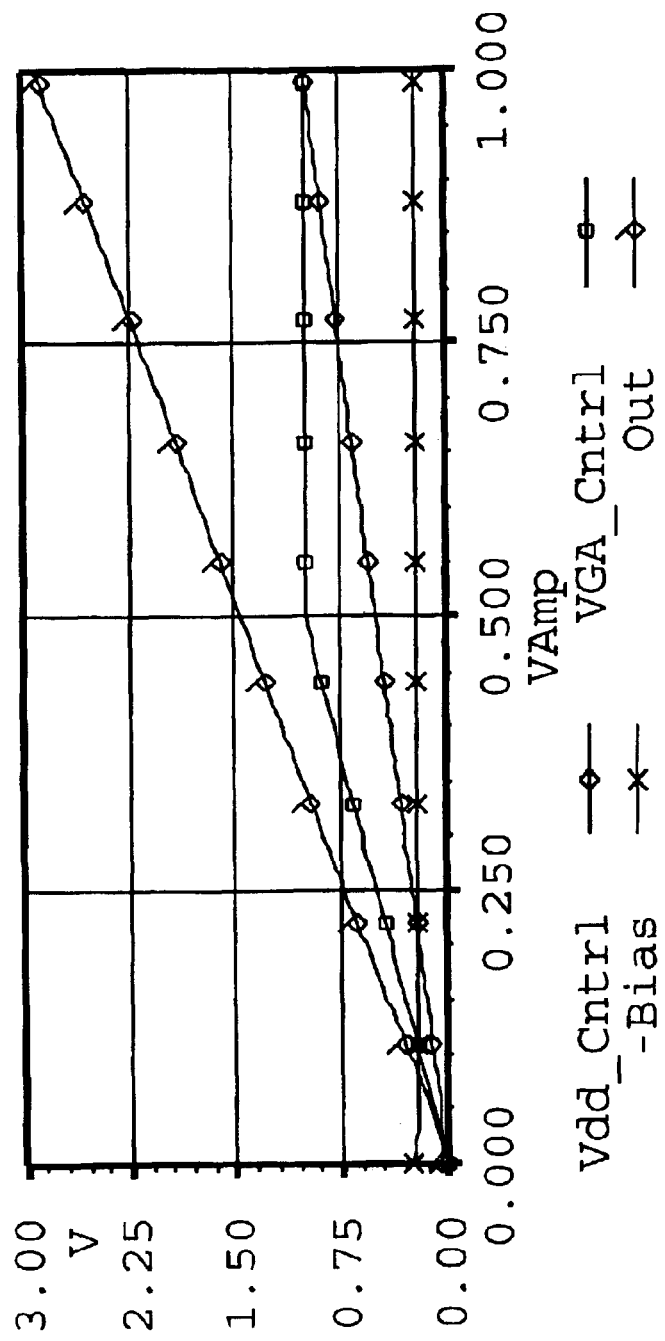
FIG. 7 is a diagram presenting exemplary control voltages employed in the power control structure of FIG. 6 for an amplitude control and a resulting output voltage.
Figure 8:
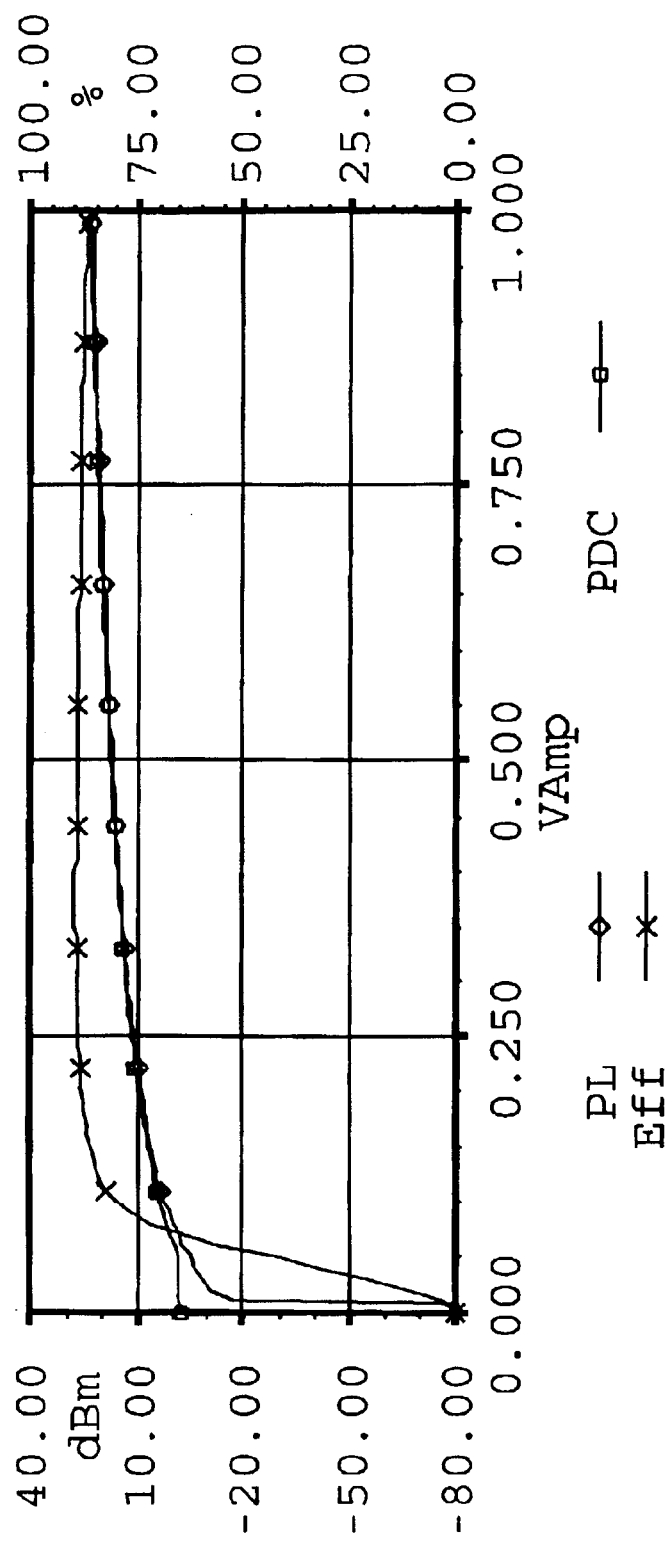
FIG. 8 is a diagram illustrating effects of the control voltages presented in FIG. 7 in the structure of FIG. 6.

The difference of the effect of varying the amplitude control voltage VAmp when compared to varying the power control voltage VPower in the structure of FIG. 1 is presented in FIGS. 7 and 8.

FIG. 7 depicts the control voltages Vdd_Cntrl, VGA_Cntrl and 'Bias', and the voltage 'Out' of the output signal over the amplitude control voltage VAmp. The digital word representing the power control voltage VPower has been set to correspond to a desired maximum power level of the output signal of 3 V. The values of the control voltage 'Bias' are negative values again. For the amplitude control voltage VAmp, a linear scale has been used. It can be seen that the output voltage 'Out' depends linearly on the amplitude control voltage VAmp.

At low power levels, the amplitude modulation is included in the radio frequency signal applied to the input of the power amplifier, since the control signal VGA_Cntrl varies linearly with the amplitude control voltage VAmp, while the control signal Vdd_Cntrl is constant. At medium power levels, the amplitude modulation is included in both, the radio frequency signal applied to the input of the switching mode power amplifier and the voltage Vdd supplied to the voltage supply terminal of the switching mode power amplifier, since both control signals VGA_Cntrl and Vdd_Cntrl vary linearly with the amplitude control voltage VAmp. At high power levels, the amplitude modulation is included in the voltage Vdd supplied to the voltage supply terminal of the switching mode power amplifier, since the control signal Vdd_Cntrl varies linearly with the amplitude control voltage VAmp, while the control signal VGA_Cntrl is constant.

FIG. 8 is a diagram depicting the power level PL of the output signal, the DC-power PDC and the efficiency Eff of the switching mode power converter over the amplitude control voltage VAmp. The scale in dBm for the output power PL and for the DC-power PDC is shown at the y-axis on the left hand side, while the percentage values % of the efficiency EFF are shown at the y-axis on the right hand side of the diagram. It can be seen that the power level PL in decibels does not follow any more the amplitude control voltage VAmp linearly. But the effect seen in FIG. 7 is what is required for the desired amplitude modulation.

Figure 9:
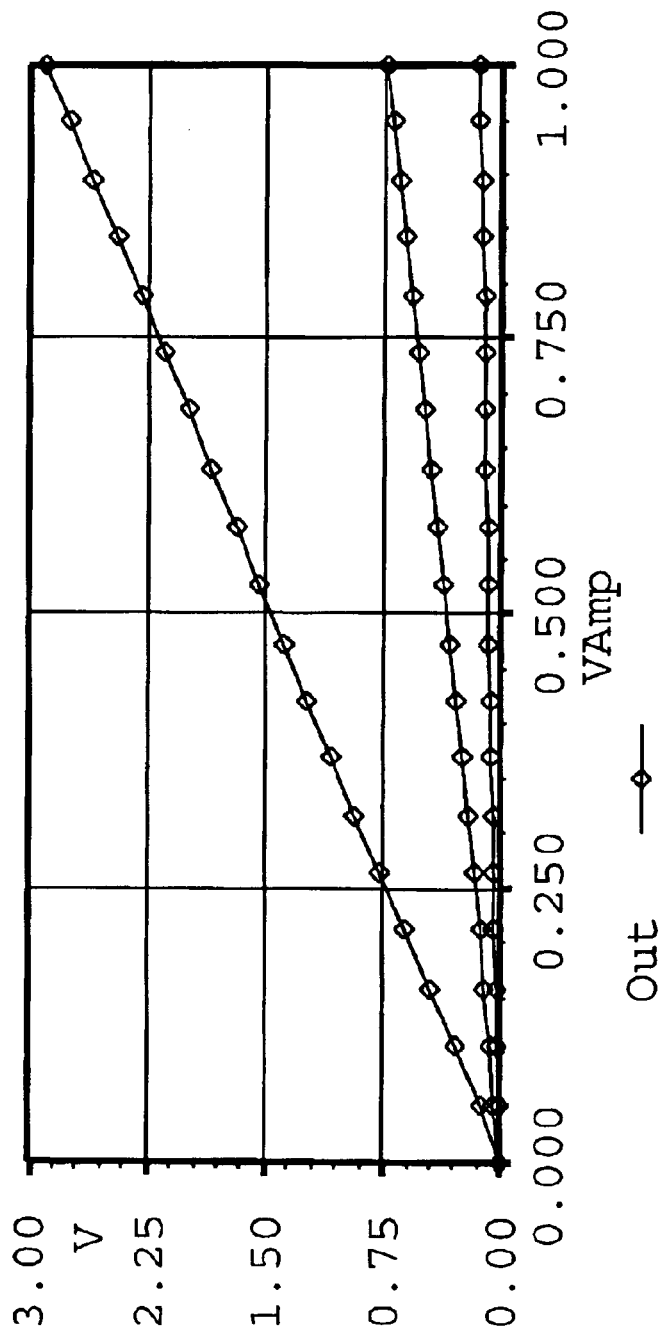
FIG. 9 is a diagram illustrating the output voltage in the structure of FIG. 6 as a function of an amplitude control voltage for different output power levels.

FIG. 9 is a diagram showing the output voltage 'Out' which results when the amplitude control voltage VAmp is changed linearly at three different fixed values of the power control voltage VPower. As can be seen, there is a linear relationship between the amplitude control voltage VAmp and the output signal voltage 'Out' for each fixed value of the power control voltage VPower. For demonstration purposes, all three fixed values of the power control voltage VPower were selected to be rather high, lest the lowest lines representing the output voltage 'Out' would coincide with the x-axis of the diagram.

As $V_{Log}(t)$ is a very slowly varying entity when compared to VAmp(t), $V_{Log}(t)$ can be considered in most cases to be constant, i.e. $V_{Log}(t)=V_{Log}$. As a consequence, the inclusion of the amplitude control voltage VAmp(t) increases the bandwidth requirements on the DACs 7, 9, 10, the DC/DC-converter 8 and any other operational block in the three control arrangements. An exception might be the bias control, since it might be feasible to tune the bias voltage as a function of the power control voltage VPower only. It also has to be noted that the linearity requirement on an amplitude control is more stringent than the linearity requirement on a mere power control.

In both presented embodiments, the control signals output by the DACs 7 and 9 could also be suitable analog currents. Moreover, the DC/DC converter 8 and/or the VGA 2 could also be digitally controllable in some cases, which would make the associated DACs 7 and 9 obsolete. Further, instead of digital words representing the power control voltage VPower and, in the second embodiment, the amplitude control voltage VAmp, also analog voltages could be employed for representing the power control voltage VPower and the amplitude control voltage VAmp.

While there have shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power control structure comprising:
    a switching mode power amplifier for receiving an input signal, for amplifying said received input signal and for providing said amplified signal as output signal;

a first control arrangement for controlling the power level of said output signal at least at higher power levels desired for said output signal by adjusting a power supply provided to said switching mode power amplifier; and a second control arrangement for controlling the power level of said output signal at least at lower power levels desired for said output signal by adjusting the power of said input signal before it is provided to said switching mode power amplifier and by utilizing a leakage through the switching mode amplifier.

2. The power control structure according to claim 1, wherein said first control arrangement comprises a first control unit for receiving a power amplifier control signal having a value representative at least of a power level desired for said output signal, said first control unit mapping said value of said power amplifier control signal to a value of a power supply control signal which, compared to said power amplifier control signal, is relatively higher for higher desired output power levels than for lower desired output power levels, and wherein said first control arrangement further comprises a power regulating unit receiving said power supply control signal from said first control unit, which power regulating unit adjusts said power supply provided to said switching mode power amplifier in accordance with said .power supply control signal.

3. The power control structure according to claim 2, wherein said first control unit maps values of said power amplifier control signal to a basically constant value of said power supply control signal at lower desired output power levels and to increasing values of said power supply control signal for increasing values of said power amplifier control signal at higher desired output power levels.

4. The power control structure according to claim 1, wherein said second control arrangement comprises a second control unit for receiving a power amplifier control signal having a value representative at least of a power level desired for said output signal, said second control unit mapping said value of said power amplifier control signal to a value of an input control signal which, compared to said power amplifier control signal, is relatively higher for lower desired output power levels than for higher desired output power levels, and wherein said second control arrangement further comprises a variable gain amplifier via which said input signal is provided to said switching mode power amplifier, said second control unit providing said input control signal to said variable gain amplifier and said variable gain amplifier pre-amplifying said input signal in accordance with said input control signal.

5. The power control structure according to claim 4, wherein said second control unit maps values of said amplifier control signal to increasing values of said input control signal for increasing values of said amplifier control signal at lower desired output power levels and to a basically constant value of said input control signal at higher desired output power levels.

6. The power control structure according to claim 1, further comprising a third control arrangement for adjusting a bias voltage applied to a transistor of said switching mode power amplifier in accordance with a desired output power level to optimize the efficiency of said switching mode power amplifier.

7. The power control structure according to claim 6, wherein said third control unit sets said bias voltage to a higher value at higher desired output power levels and to a lower value at lower desired output power levels.

8. The power control structure according to claim 1, further comprising a phase correction component for adjusting the phase of said input signal in accordance with a desired power level before said input signal is provided to said switching mode power amplifier.

9. The power control structure according to claim 1, further comprising a control signal generation arrangement for generating a power amplifier control signal having a value representative at least of a power level desired for said output signal and for providing said power amplifier control signal at least to said first and said second control arrangement.

10. The power control structure according to claim 9, wherein said control signal generation arrangement comprises a first signal generation portion for generating control signals having values representative of a desired power level of said output signal, a second signal generation portion for generating control signals having values representative of a desired amplitude modulation of said output signal, and a combining portion for combining said signals provided by said first and said second generation portion, a respective resulting combined signal being provided by said control signal generation arrangement as power amplifier control signal at least to said first and said second control arrangement.

11. The power control structure according to claim 1, wherein said power control structure constitutes a transmitter.

12. A method of controlling at least a power level of an output signal of a switching mode power amplifier, which switching mode power amplifier receives an input signal, amplifies said received input signal and provides said amplified signal as output signal, said method comprising:

controlling the power level of said output signal by adjusting a power supply provided to said switching mode power amplifier at least when higher power levels are desired for said output signal; and controlling the power level of said output signal by adjusting the power of said input signal before it is provided to said switching mode power amplifier at least when lower power levels are desired for said output signal and by utilizing a leakage through the switching mode power supply.

13. The method according to claim 12, wherein adjusting a power supply provided to said switching mode power amplifier comprises:

mapping a value of an available power amplifier control signal, which power amplifier control signal is representative at least of a power level desired for said output signal, to a value of a power supply control signal which, compared to said power amplifier control signal, is relatively higher for higher desired output power levels than for lower desired output power levels; and adjusting said power supply provided to said switching mode power amplifier in accordance with said power supply control signal.

14. The method according to claim 13, wherein values of said power amplifier control signal are mapped to a basically constant value of said power supply control signal at lower desired output power levels and to increasing values of said power supply control signal for increasing values of said power amplifier control signal at higher desired output power levels.

15. The method according to claim 12, wherein adjusting the power of said input signal comprises:

mapping a value of a power amplifier control signal, which power amplifier control signal has a value representative at least of a power level desired for said output signal, to a value of an input control signal which, compared to said power amplifier control signal, is relatively higher for lower desired output power levels than for higher desired output power levels; and pre-amplifying said input signal in accordance with said input control signal.

16. The method according to claim 15, wherein values of said amplifier control signal are mapped to increasing values of said input control signal for increasing values of said amplifier control signal at lower desired output power levels and to a basically constant value of said input control signal at higher desired output power levels.

17. The method according to claim 12, further comprising adjusting a bias voltage applied to a transistor of said switching mode power amplifier in accordance with a desired output power level to optimize the efficiency of said switching mode power amplifier.

18. The method according to claim 17, wherein said bias voltage is set to a higher value at higher desired output power levels and to a lower value at lower desired output power levels.

19. The method according to claim 12, further comprising adjusting the phase of said input signal in accordance with a desired power level before said input signal is provided to said switching mode power amplifier.

20. The method according to claim 12, further comprising generating a power amplifier control signal having a value representative at least of a power level desired for said output signal as basis for controlling the power level of said output signal.

21. The method according to claim 20, wherein generating said power amplifier control signal comprises generating control signals having values representative of a desired power level of said output signal, generating control signals having values representative of a desired amplitude modulation of said output signal, and combining said signals, a respective resulting combined signal constituting said power amplifier control signal.

* * * * *